(12) United States Patent
Gruhlke

(10) Patent No.: US 7,148,516 B2
(45) Date of Patent: Dec. 12, 2006

(54) COLOR-TUNABLE LIGHT EMITTER

(75) Inventor: Russell W. Gruhlke, Fort Collins, CO (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 279 days.

(21) Appl. No.: 10/821,087

(22) Filed: Apr. 8, 2004

(65) Prior Publication Data

US 2005/0224814 A1    Oct. 13, 2005

(51) Int. Cl.
*H01L 33/00* (2006.01)

(52) U.S. Cl. .................. 257/89; 257/98; 257/E51.021; 257/E33.067

(58) Field of Classification Search .................. 257/98, 257/89, E51.021, E33.067
See application file for complete search history.

(56) References Cited

U.S. PATENT DOCUMENTS

| 4,915,482 | A | * | 4/1990 | Collins et al. | ............. | 359/276 |
| 5,841,143 | A | * | 11/1998 | Tuma et al. | ............. | 250/458.1 |
| 6,956,221 | B1 | * | 10/2005 | Gruhlke | ................... | 250/458.1 |
| 2005/0035346 | A1 | * | 2/2005 | Bazan et al. | .................. | 257/40 |

* cited by examiner

*Primary Examiner*—Jerome Jackson

(57) ABSTRACT

The color-tunable light emitter has a first electrode and a light-generating layer adjacent the first electrode. The light-generating layer is operable to generate light in a band of wavelengths. The color-tunable light emitter also includes an electro-optical layer, a second electrode adjacent the electro-optical layer and a corrugated metal layer between the light-generating layer and the electro-optical layer. The corrugated metal layer couples a sub-band of the light from the light-generating layer to the electro-optical layer. The sub-band has a center wavelength dependent on a voltage applied to at least one of the electrodes.

25 Claims, 7 Drawing Sheets

COLOR-TUNABLE LIGHT EMITTER

TECHNICAL FIELD

The technical field of this disclosure is light emitters, particularly, color-tunable light emitters for color displays in which the color of the light emitted by the individual light emitters is tunable.

BACKGROUND OF THE INVENTION

Color pixels used in color displays are typically formed of three light sources, or subpixels, each emitting light of a different wavelength. Typically, one subpixel emits red light, one subpixel emits green light, and one subpixel emits blue light. The apparent color of the pixel depends on the relative intensities of the three colors. The apparent color is determined by the current applied to each of the three subpixels.

Packaging the subpixels into the pixels of a display is complex and costly. Light-emitting diodes are commonly used as subpixels. The light-emitting diodes of the subpixels are each formed from different semiconductor materials, so the individual light-emitting diodes of the subpixels cannot be combined. The size of pixels must be less than the resolution of the human eye to prevent the observer from discerning the individual pixels. The subpixels must be smaller than the individual pixel to fit within the individual pixel. Each subpixel typically also includes associated electronics to enable the subpixel to be individually addressable.

Use of subpixels emitting light at a particular wavelength also causes problems with color quality as the display ages. As light-emitting diodes age, the intensity emitted for a given applied current changes. Red, green, and blue light-emitting diodes typically age at different rates. Because the apparent color of the pixel depends on the relative intensities of the three colors and the intensity of the three light-emitting diodes shifts with time, the apparent color for a given relative current profile will shift over time.

SUMMARY OF THE INVENTION

Embodiments of the present invention provide a color-tunable light emitter operable to generate light whose color depends on an applied voltage. A light-generating layer generates light in a band of wavelengths. A sub-band of this light is coupled to an electro-optical layer by plasmons generated in a corrugated metal layer disposed between the light-generating layer and the electro-optical layer. The sub-band has a center wavelength determined by the refractive index of the electro-optical layer. The light coupled to the electro-optical layer passes through the electro-optical layer and is emitted by the color-tunable light emitter. Changing the electric field applied to the electro-optical layer changes the index of refraction of the electro-optical layer, which changes the center wavelength of the sub-band of light coupled through the corrugated metal layer. This changes the color of the light emitted by the color-tunable light emitter. Thus, the electric field applied to the electro-optical material tunes the color of the light emitted by the color-tunable light emitter.

One aspect of the present invention provides a color-tunable light emitter that includes a first electrode and a light-generating layer adjacent the first electrode. The light-generating layer is operable to generate light in a band of wavelengths. The color-tunable light emitter also includes an electro-optical layer, a second electrode adjacent the electro-optical layer, and a corrugated metal layer between the light-generating layer and the electro-optical layer. The corrugated metal layer couples a sub-band of the light generated by the light-generating layer to the electro-optical layer. The sub-band has a center wavelength dependent on voltage applied to at least one of the electrodes.

Another aspect of the invention provides a method of generating color-tunable light. In the method, an electro-optical layer and a corrugated metal layer are provided. The corrugated metal layer is juxtaposed with the electro-optical layer. The corrugated metal layer is illuminated with light in a band of wavelengths. A sub-band of the light is coupled through the corrugated metal layer to the electro-optical layer. The refractive index of the electro-optical layer is adjusted to tune the center wavelength of the sub-band of light coupled through the corrugated metal layer.

Another aspect of the invention provides a color display. The color display has opposed electrodes, and a layer structure comprising a light-generating layer, an electro-optical layer and a corrugated metal layer between the electrodes. At least one of the electrodes is composed of electrode segments that define respective color-tunable light emitters. The light-generating layer is operable to generate light in a band of wavelengths. The corrugated metal layer is located between the light-generating layer and the electro-optical layer, and couples a sub-band of the light generated by the light-generating layer to the electro-optical layer. The sub-band has a center wavelength. The center wavelength of each of the color-tunable light emitters depends on a voltage applied to the respective one of the electrode segments.

The above and other features and advantages of the invention will become further apparent from the following detailed description of the presently preferred embodiments, read in conjunction with the accompanying drawings. The detailed description and drawings are merely illustrative of the invention, rather than limiting the scope of the invention being defined by the appended claims and equivalents thereof.

DETAILED DESCRIPTION OF THE PRESENTLY PREFERRED EMBODIMENTS

The invention is based on the observation that the above-described size and aging problems can be avoided by using for each pixel a single light emitter capable of emitting light in a range of colors and that does not rely on the relative light intensity from three individual light emitters, each emitting light of a single color. Such a light emitter, referred to herein as a color-tunable light emitter, is capable of emitting light of a color defined by an applied voltage. In accordance with the invention, the color-tunable light emitters used in a display are all the same and do not rely on different colored subpixels. Each color-tunable light emitter is individually addressable. Moreover, the color-tunable light emitter saves space, ages at the same rate as all the other color-tunable light emitters in the display, and maintains a consistent color quality as it ages.

Figure 1:
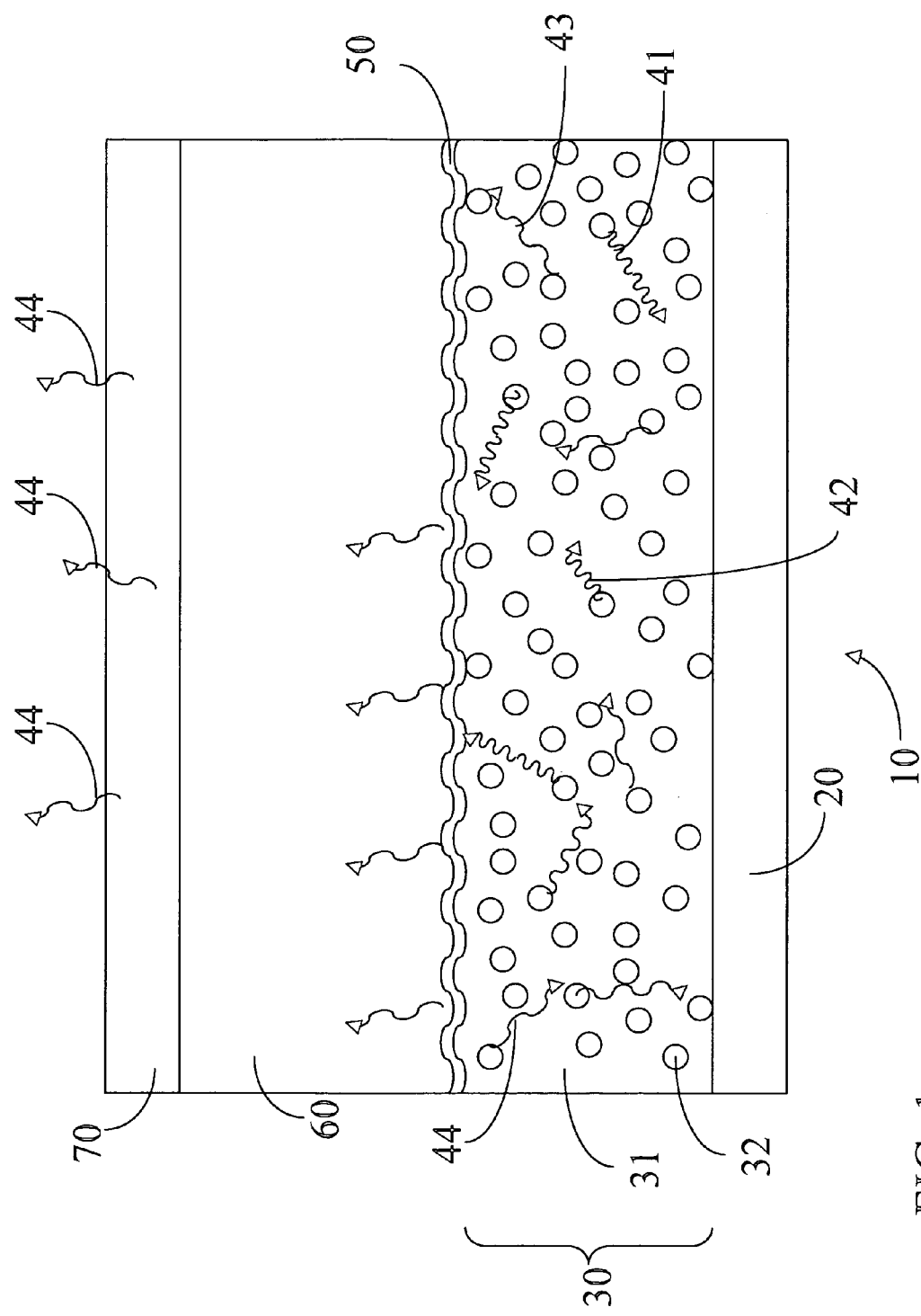
FIG. 1 is a cross section schematic diagram of a color-tunable light emitter according to a first embodiment of the invention.

FIG. 1 is a schematic cross sectional view of a first embodiment of a color-tunable light emitter 10 in accordance with the present invention. A dielectric light-generating layer 30 is located adjacent a first electrode 20. The light-generating layer 30 includes a matrix material 31, such as a polymer, containing polyatomic luminescent molecules 32. A second electrode 70 covers an electro-optical layer 60. The second electrode 70 is transparent in the specified emission wavelength range of the color-tunable light-emitter 10. A corrugated metal layer 50 is located between the dielectric light-generating layer 30 and the electro-optical layer 60 in contact with the electro-optical layer 60. The period of the corrugations in the corrugated metal layer 50 is $\Lambda$.

When no voltage is applied between the first electrode 20 and second electrode 70, no light is generated in light-generating layer 30, so that the light emitter 10 is dark. A voltage applied between the first electrode 20 and second electrode 70 causes the light-generating layer 30 to generate light in a band of wavelengths that includes the specified emission wavelength range of the color-tunable light-emitter 10. The band of wavelengths includes a first wavelength 41, a second wavelength 42, a third wavelength 43, and a fourth wavelength 44. The voltage excites the luminescent molecules 32 and causes them to generate light that they emit in random directions.

The word "light" as used in this disclosure refers to electromagnetic radiation in the wavelength range from ultraviolet to infrared. For color display applications, the wavelength range is the visible wavelength range from about 400 nm to 700 nm. Additionally or alternatively, the light emitter may be designed to emit in the ultra-violet and infrared regions.

In the absence of an electric field applied to the electro-optical layer 60, the corrugated metal layer 50 is optically opaque in the band of wavelengths generated by the light-generating layer 30, including wavelengths 41 through 44. However, the voltage applied between the first electrode 20 and second electrode 70 that excites the luminescent molecules 32 also changes the index of refraction of the electro-optical layer 60, which alters the cross coupling of the light generated by the light-generating layer 30 through the corrugated metal layer 50 to the electro-optical layer 60 in a sub-band of the band of wavelengths generated by the light-generating layer 30. In the example shown in FIG. 1, the sub-band includes fourth wavelength 44. Consequently, light of fourth wavelength 44 passes through the electro-optical layer 60 and the second electrode 70 and is output as the output light of color-tunable emitter 10.

The cross-coupling in the corrugated metal layer 50 causes the transmission of light generated within the light-generating layer 30 through the corrugated metal layer 50 into the electro-optical layer 60. This light transmission is effected by surface plasmons. A surface plasmon is a specific form of radiation in which an evanescent traveling wave is bound to a metal-dielectric interface. Cross coupling occurs when identical wave number vector components parallel to the corrugated metal layer 50 are supported in the light-generating layer 30 and in the electro-optical layer 60.

The sub-band of light cross coupled through the corrugated metal layer 50, passing through electro-optical layer 60 and the second electrode 70 and emitted by the color-tunable light emitter 10 is narrow in bandwidth. The light emitted by the color-tunable light emitter 10 can therefore be regarded as being monochromatic light having a wavelength equal to the center wavelength of the sub-band.

The first electrode 20 is a layer of a conductive material, such as aluminum, copper, or silver, having a thickness in the range from about 50 m to about several millimeters.

The light-generating layer 30 has a thickness in the range from about 50 nm to about 1,000 nm. Polyatomic luminescent molecules 32 are molecules that can be excited from the ground state to an excited state. Photons are emitted as the molecules revert to their ground state. The emitted light is called luminescence. Specifically, the emitted light is called electroluminescence when the molecules are excited by an electric field. The emitted light is called photoluminescence when the molecules are excited by absorption of photons, such as by optically pumping the photo-luminescent material. The light is called cathode-luminescence when the molecules are excited by bombardment with electrons in an electron beam.

Molecules that can be used as luminescent molecules 32 in the light-generating layer 30 include quinine, fluorescein, rhodamine B, and polynuclear aromatic hydrocarbons, such as anthracene and perylene. Suitable emissive polymer materials, in which at least 1% of the input electrical energy is converted to light, include poly p-phenylene vinylene (PPV) and classes of soluble conjugated polymers including the polyfluorene family, such as poly(9,9'-dioctylfluorene). The electrical properties of the polymer, such as band gap, electron affinity, and charge transport, can be tuned by modifying the constituent groups in the polymer and/or the molecular weight. The rheological properties, such as viscosity and solubility, can also be tailored in this manner for the desired application and deposition method. A broad spectral range can be obtained by blending different polymers together or by changing the chemical composition. Phosphors for cathode-luminescence can be chosen from several chemical compositions, including $Y_2O_3$:Eu, $(Y,Gd)BO_3$:Eu, $Zn_2SiO_4$:Mn, $BaO.6Al_2O_3$:Mn and $BaMg_2Al_{16}O_{27}$:Eu, which are commercially available from Phosphor Technology Ltd.

The material of the corrugated metal layer 50 is silver, gold, copper, platinum, or combinations thereof. The corrugated metal layer 50 has a thickness of about 50 nm and its grating period $\Lambda$ is in the range from about 0.5 μm to about 20 μm.

The second electrode 70 is a layer of a conductive material, such as indium tin oxide, that is transparent in the specified emission wavelength range of the color-tunable light-emitter 10 having a thickness in the range from about 0.1 μm to about 1 μm.

The electro-optical layer 60 is a layer of electro-optical material such as nematic liquid crystal, electro-optic semiconductor, lithium niobate, or lithium tantalate. In one embodiment, the electro-optical material is a nematic liquid crystal material encapsulated in a porous silicon matrix. The electro-optical layer 60 has a thickness in the range from about 0.5 μm to about 1.0 μm. In one embodiment, applying an electric field strength about $10^7$ V/m across the electro-optical layer 60 changes the index of refraction n of the electro-optic material by 0.20.

Surface plasmons can be generated over a broad range of wavelengths. The exact range depends on the spectral characteristics of the surface plasmon excitation mechanism. When conditions are appropriate to support surface plasmons having the same wavelength on both sides of the corrugated metal layer 50, as will be described below with reference to FIG. 2, surface plasmons supported at the interface between the corrugated metal layer 50 and the light-generating layer 30 excite surface plasmons at the same energy state on the opposite side of the corrugated metal layer 50. Light in the sub-band is cross coupled across the corrugated metal layer 50 from the light-generating layer 30 to the electro-optical layer 60. The cross-coupled sub-band of light propagates into and through the electro-optical layer 60.

Dissimilar dielectric materials on opposite sides of the corrugated metal layer 50 limit the cross coupling to the above-mentioned sub-band of the band of wavelengths generated by the light-generating layer 30. The center wavelength of the sub-band depends on the period Λ of the corrugated metal layer, of the corrugations of the corrugated metal layer 50 and the indices of refraction of the dielectric materials on each side of the corrugated metal layer. Surface plasmon cross coupling is a function of the wave number $k_z$ parallel to the corrugated metal layer 50:

$$k_z = 2\pi(\epsilon_d \epsilon_m / \epsilon_d + \epsilon_m)^{1/2} / \lambda$$

where λ is the wavelength of the surface plasmon, and $\epsilon_d$ is the permittivity of the dielectric material juxtaposed with the corrugated metal layer 50 and $\epsilon_m$ is the permittivity of the metal of the corrugated metal layer 50. Index of refraction n is related to permittivity by:

$$n = (\epsilon_d)^{1/2}.$$

The electric field applied to the electro-optical layer 60 determines the permittivity of the electro-optical layer 60 and hence its index of refraction, so that the center wavelength of the sub-band of light that is cross coupled depends on the applied electric field, i.e., the voltage between the first electrode 20 and the second electrode 70.

Figure 2:
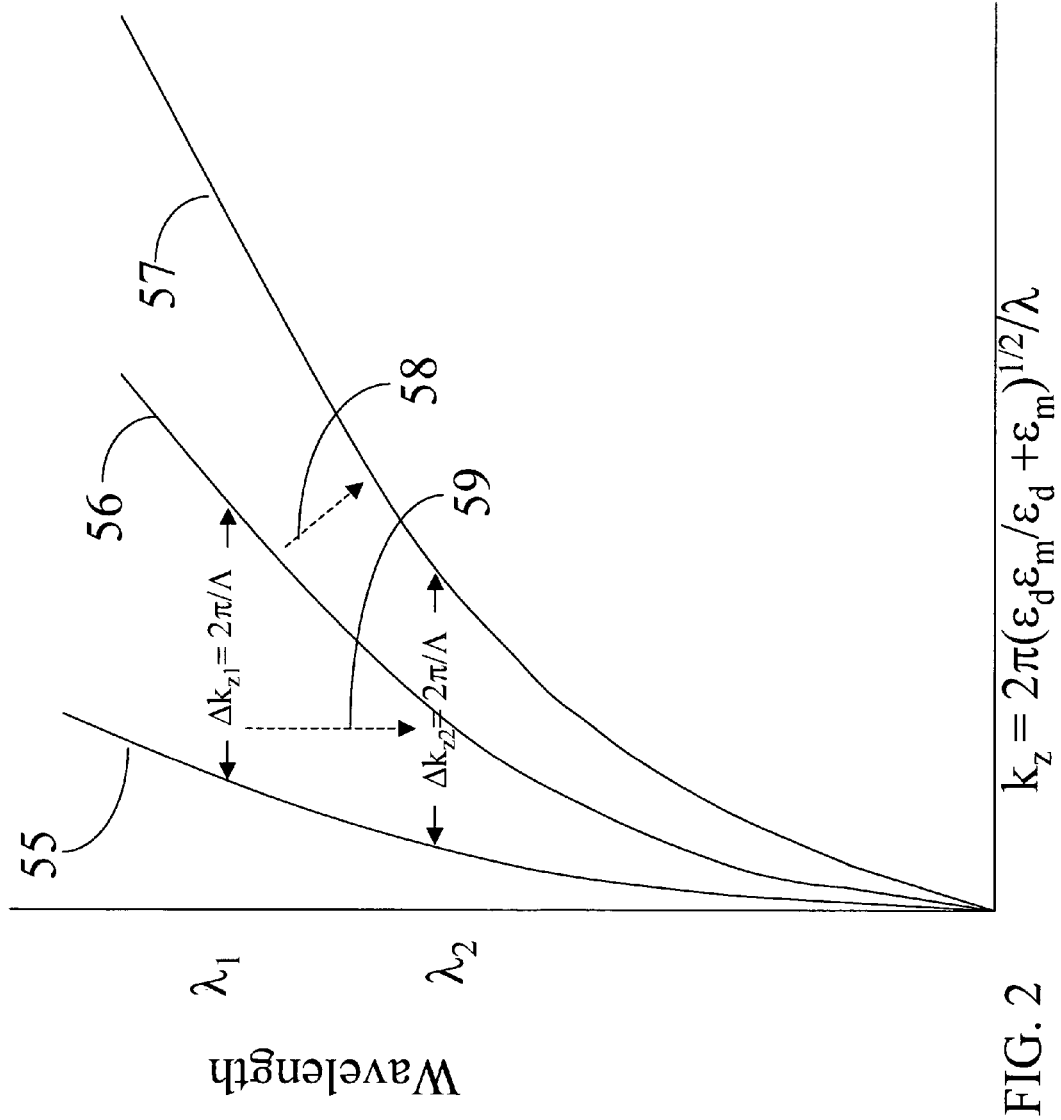
FIG. 2 is a graph of dispersion curves for various metal-dielectric interfaces.

FIG. 2 shows dispersion curves for the interface between the corrugated metal layer 50 and the light-generating layer 30, and the interface between the corrugated metal layer 50 and the electro-optical layer 60. The dispersion curves 56 and 57 are for the interface between the corrugated metal layer 50 and the electro-optical layer 60 at two different voltages applied between first electrode 20 and second electrode 70. Dispersion curve 56 applies when the electro-optical layer 60 has an index of refraction $n_1$ corresponding to an applied voltage $V_1$ and dispersion curve 57 applies when the electro-optical layer 60 has an index of refraction $n_2$ corresponding to an applied voltage $V_2$. The dispersion curve 56 approaches dispersion curve 57, as shown by dashed arrow 58, as the applied voltage is increased from $V_1$ to $V_2$. Dispersion curve 55 is for the interface between the corrugated metal layer 50 and the light-generating layer 30. Dispersion curve 55 is fixed, since the index of refraction of light-generating layer 30 does not change in response to a change in the applied voltage.

In the following description, references to the wavelength of light are to be understood to refer to the center wavelength of the sub-band of light cross coupled through the corrugated metal layer 50. Surface plasmon cross coupling occurs at a wavelength $\lambda_1$ at which the separation between the dispersion curves 55 and 56 is equal to ±2π/Λ. As the applied voltage is changed from $V_1$ to $V_2$, the dispersion curve 56 approaches dispersion curve 57, and the wavelength at which the separation of dispersion curve 56 from dispersion curve 55 is equal to ±2π/Λ changes to wavelength $\lambda_2$ as shown by dashed arrow 59. Thus, as the applied voltage is changed from $V_1$ to $V_2$ and dispersion curve 56 approaches dispersion curve 57, the center wavelength of the cross coupled sub-band of light shifts from $\lambda_1$ to $\lambda_2$ to maintain $\Delta k_z = \pm 2\pi/\Lambda$.

In operation, the voltage applied between the first electrode 20 and the second electrode 70 excites the luminescent molecules 32, generating electroluminescent light in a band of wavelengths that includes wavelengths $\lambda_1$ and $\lambda_2$. The voltage applied between the electrodes 20 and 70 also determines the refractive index of the electro-luminescent layer 60 and, hence, the center wavelength of the sub-band of light cross coupled by the corrugated metal layer 50 from the light-generating layer 30 to the electro-optical layer 60. Light at the wavelength satisfying the wave number differential condition $\Delta k_z = \pm 2\pi/\Lambda$ is cross-coupled into the electro-optical layer 60, passes through the electro-optical layer and the second electrode 70 and is emitted by the color-tunable light emitter 10 as output light. In the example shown in FIG. 1, the output light is of fourth wavelength 44. Changing the voltage applied between the electrodes 20 and 70 changes the index of refraction of the electro-optical layer 60, which changes the wavelength that satisfies the wave number differential condition $\Delta k_z = \pm 2\pi/\Lambda$ and hence, the wavelength of the output light emitted by the color-tunable light emitter 10. Thus, the wavelength of the output light emitted by the color-tunable light emitter 10 is tuned by the voltage applied between the electrodes.

Figure 3:
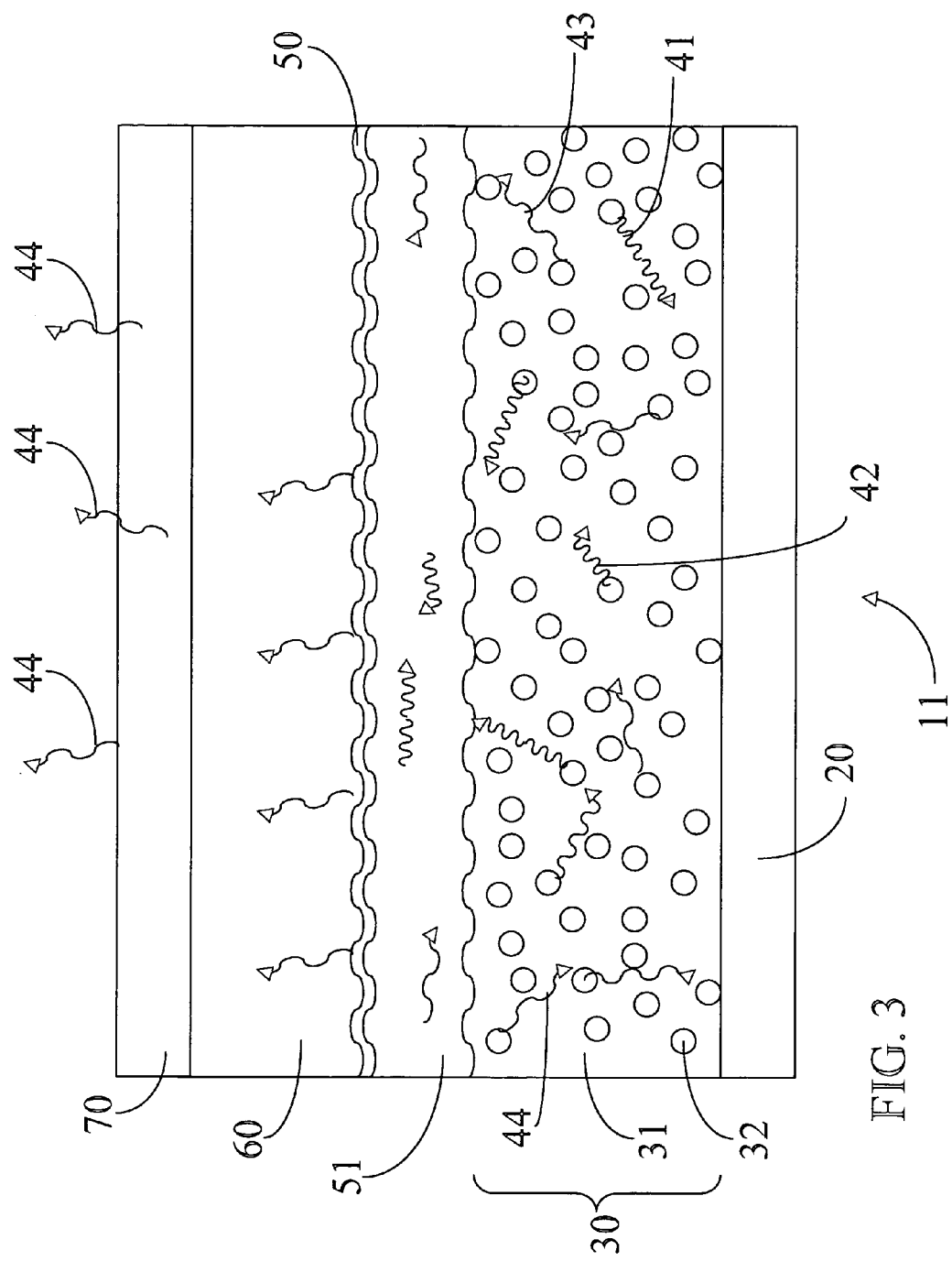
FIG. 3 is a schematic cross sectional view of a color-tunable light emitter according to a second embodiment of the invention.

FIG. 3, in which like elements share like reference numbers with FIG. 1, is a schematic cross-sectional view showing a second embodiment of a color-tunable light emitter 11 in accordance with the present invention. Light emitter 11 is similar to light emitter 10 except for a dielectric waveguide 51 interposed between the light-generating layer 30 and the corrugated metal layer 50. The waveguide 51 is formed of dielectric material, such as fused silica or nitrides, and has a thickness in the range from about 500 nm to about 1 μm. Waveguide 51 supports the propagation of light in the band of wavelengths generated by the light-generating layer 30, including first wavelength 41, second wavelength 42, third wavelength 43, and fourth wavelength 44. Waveguide 51 increases the probability that light generated by the light-generating layer 30 generates surface plasmons in the corrugated metal layer 50 by increasing the interaction between luminescent molecules 32 and the surface plasmons. This enhances the radiated decay mechanism resulting in the excitation of surface plasmons. The presence of the waveguide layer also prevents the quenching of the radiative decay mechanism of the luminescent molecules 32. Cross coupling also occurs between the waveguide mode on one side of the corrugated metal layer to surface plasmon modes on the opposite side of the corrugated metal layer.

The waveguide 51 shown in FIG. 3 is corrugated on both sides. This occurs as the result of forming a grating in surface of the light-generating layer 30 before deposition of the dielectric material to form waveguide 51. In an alternative embodiment, no grating is formed in the surface of the light-generating layer 30 before the waveguide material is deposited. A grating pattern is then formed in the exposed surface of the waveguide 51 and the corrugated metal layer 50 deposited on the grating pattern. In this embodiment, the interface between the waveguide 51 and the light-generating layer 30 is relatively smooth. In some embodiments, the grating patterns are formed by chemical etching.

Figure 4:
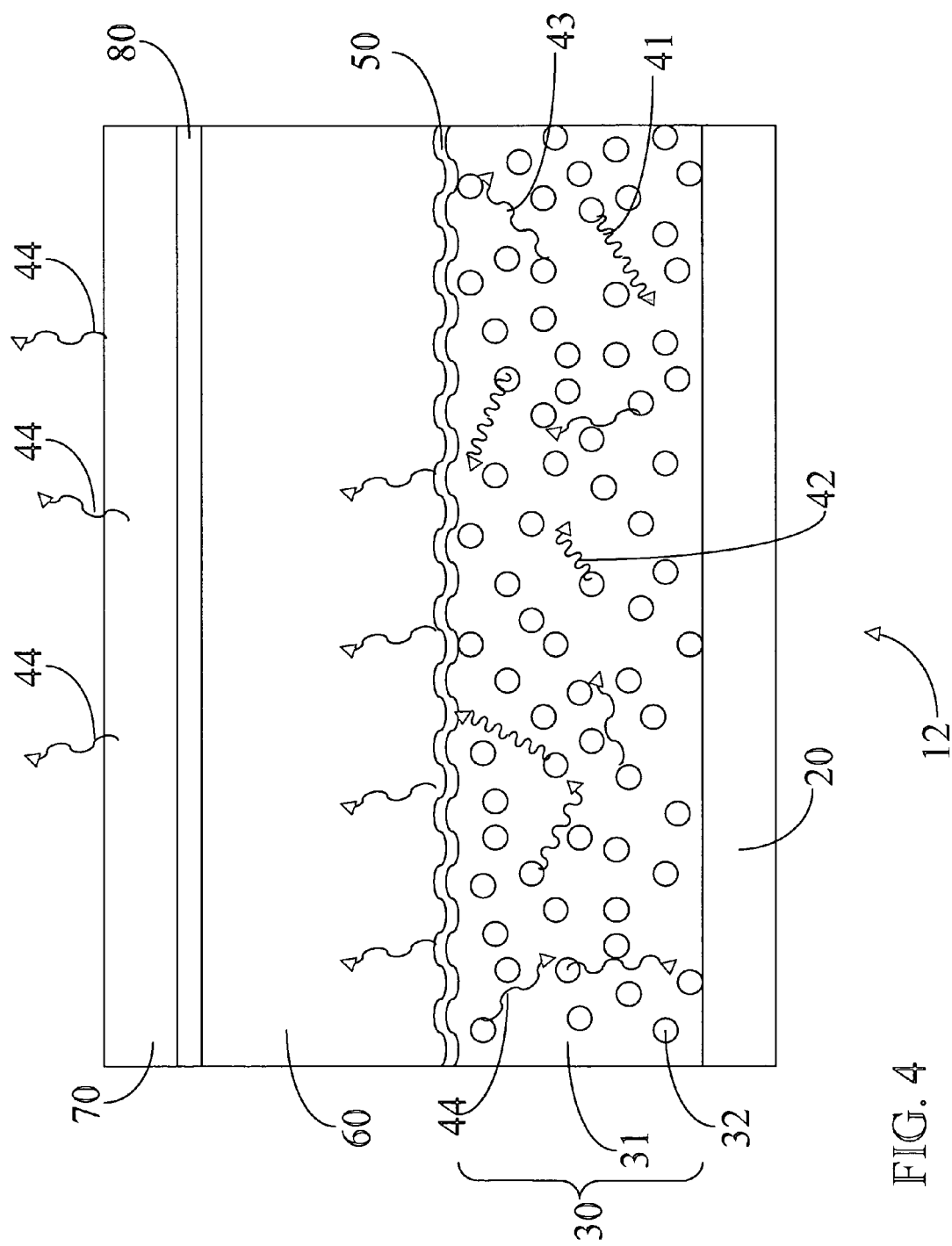
FIG. 4 is a schematic cross sectional view of a color-tunable light emitter according to a third embodiment of the invention.

FIG. 4, in which like elements share like reference numbers with FIG. 1, is a schematic cross sectional view showing a third embodiment of a color-tunable light emitter 12 in accordance with the present invention. Light emitter 12 is similar to light emitter 10 except that an optical diffuser 80 is interposed between the electro-optical layer 60 and the second electrode 70. Light cross coupled through the corrugated metal layer 50 is transmitted through the electro-optical layer 60 at a wavelength-dependent angle that is not necessarily normal to the surface of the second electrode 70. The emission angle is randomized by the optical diffuser 80, which increases the range of viewing angles of the light emitter 12. Several types of diffuser are commercially available, including holographic diffusers, opal glass diffusers, and ground glass diffusers. Opal glass diffusers produce a near Lambertian source, but have high scatter loss. Ground glass diffusers are less diffusive and have less loss. Color-tunable light emitter 12 may additionally include a dielectric waveguide similar to dielectric waveguide 51 shown in FIG. 3.

Figure 5:
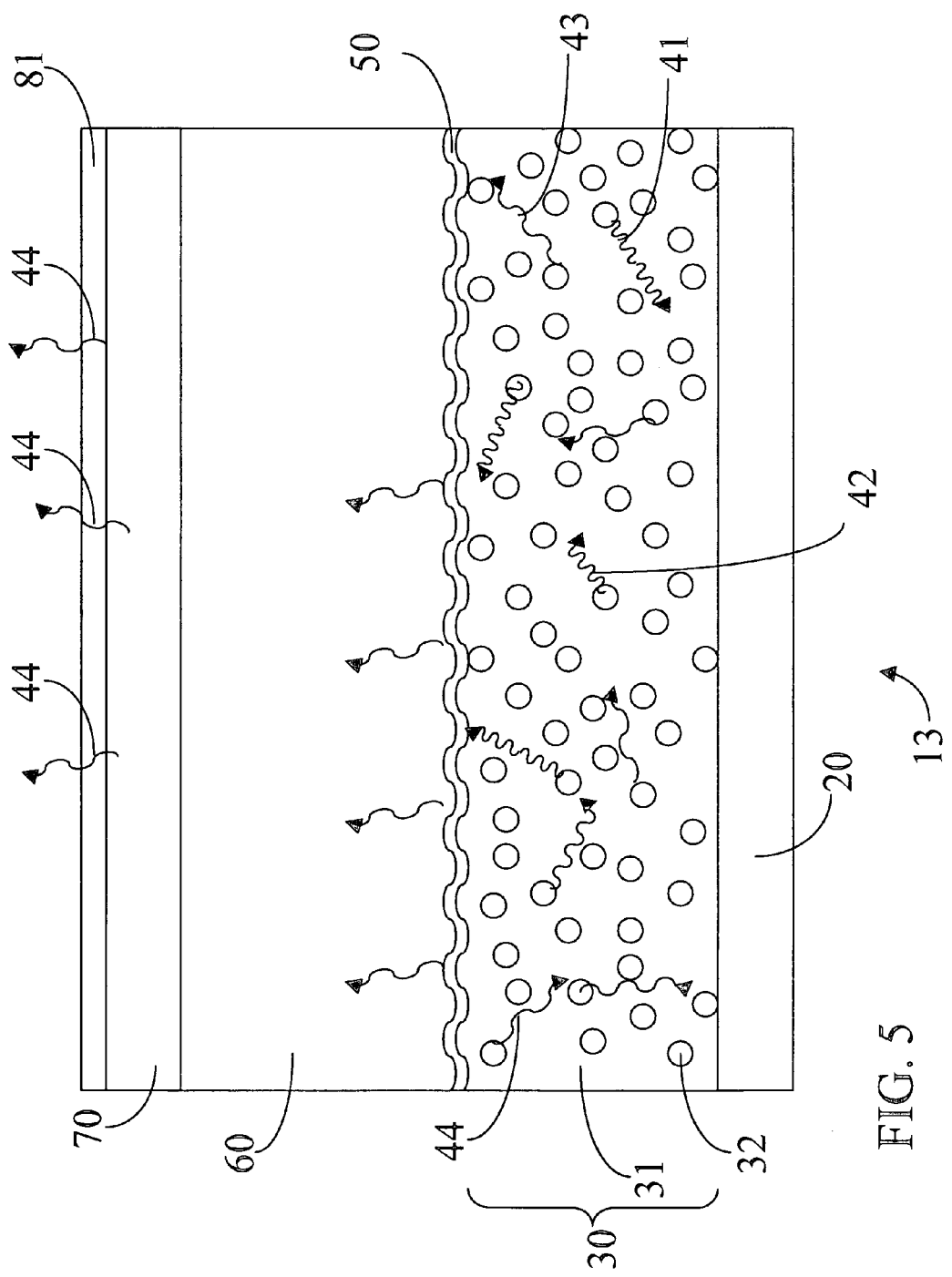
FIG. 5 is a schematic cross sectional view of a color-tunable light emitter according to a fourth embodiment of the invention.

FIG. 5, in which like elements share like reference numbers with FIG. 4, is a schematic cross-sectional view showing a fourth embodiment of a color-tunable light emitter 13 in accordance with the present invention. Light emitter 13 is similar to light emitter 12 except that optical diffuser 81 is located on the side of the second electrode 70 remote from the electro-optical layer 60, instead of interposed between the electro-optical layer 60 and the second electrode 70. Color-tunable light emitter 13 may additionally include a dielectric waveguide similar to dielectric waveguide 51 shown in FIG. 3.

Figure 6:
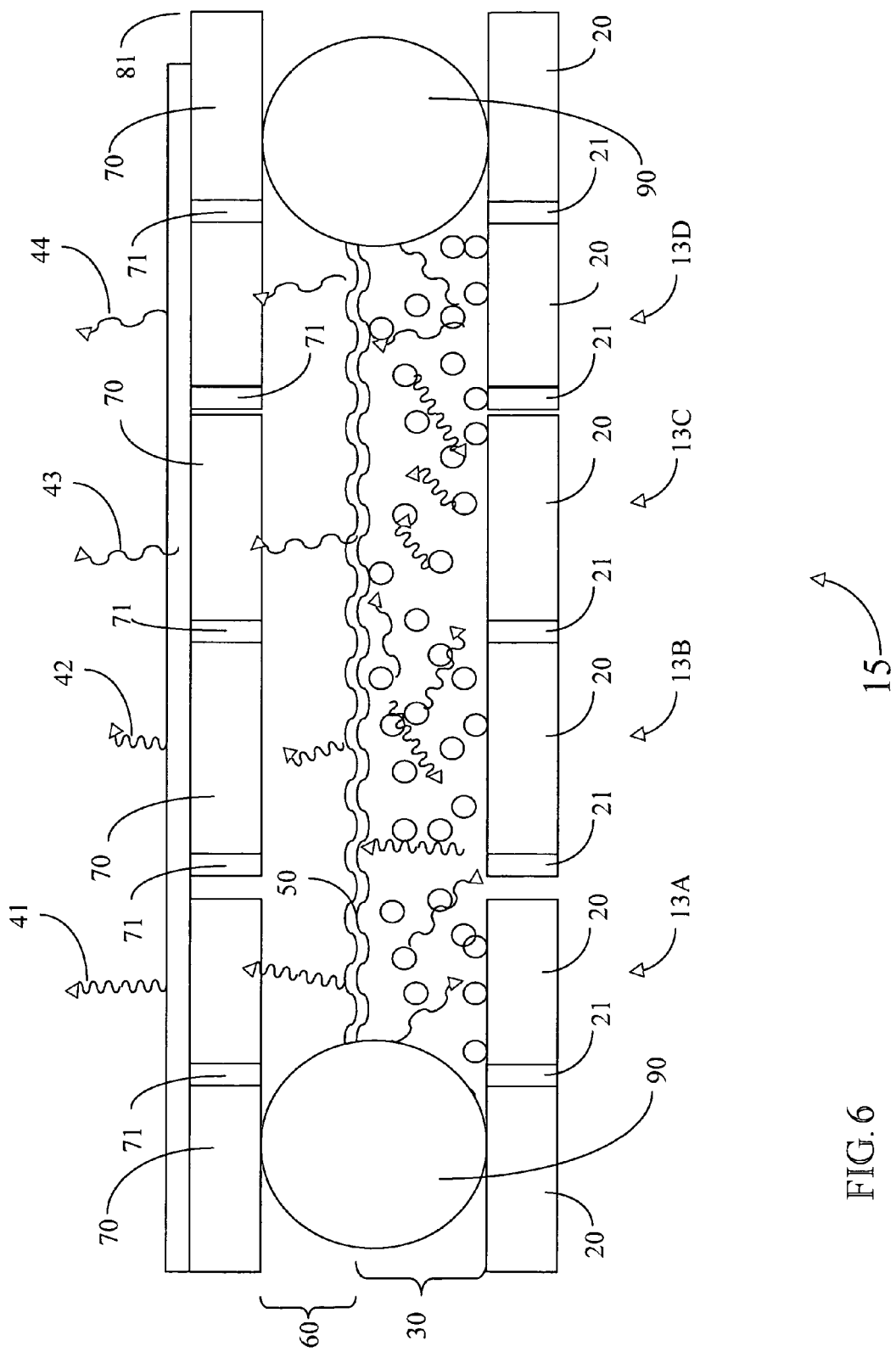
FIG. 6 is a schematic cross sectional view of a first embodiment of a display including color-tunable light emitters similar to those shown in FIG. 5.

FIG. 6, in which like elements share like reference numbers with FIG. 5, is a schematic cross-sectional view showing an embodiment of an optical display 15 in accordance with the present invention. The optical display 15 is composed of color-tunable light emitters 13A through 13D. The color-tunable light emitters 13A through 13D have a structure based on that of light emitter 13 shown in FIG. 5, but could alternatively have a structure based on those of any of the light emitters 10, 11, or 12 shown in the other figures. The light-generating layer 30 is located adjacent an array of first electrodes 20. The first electrodes are electrically isolated from one another by insulators 21. The electro-optical layer 60 is located adjacent an array of second electrodes 70 disposed opposite the array of first electrodes 20. The corrugated metal layer 50 is located between the light-generating layer 30 and the electro-optical layer 60 in contact with the electro-optical layer. The second electrodes 70 are isolated from one another by insulators 71. Spacers 90 located between the array of first electrodes 20 and the array of second electrodes 70 maintain a uniform distance between the electrodes 20 and 70. The diffuser 81 overlies the second electrodes 70. In an alternative embodiment, a common electrode (not shown) serves as the array of first electrodes 20 and no insulators 21 are required. In another alternative embodiment, a common electrode (not shown) serves as the array of second electrodes 70 and no insulators 71 are required.

The spacers 90 are dielectric beads of about equal diameter. The density of spacers 90 is kept to the minimum needed to provide uniform spacing of the first electrodes 20 from the second electrodes 70 over the area of the display 15, because the spacers 90 prevent the individual light emitters where they are located from emitting light.

The optical display 15 is formed by forming an array of first electrodes 20. In the example shown in FIG. 5 the first electrodes are shown electrically isolated from one another by insulators 21. In an embodiment, the electrodes are supported on a nonconductive substrate. The first electrodes 20 are formed by depositing a layer of a conductive material such as aluminum, copper, or gold by a deposition process such as sputtering, electroplating or electron beam evaporation.

In an embodiment, such as that shown in FIG. 5, in which a common electrode is not used as the array of first electrodes 20, the first electrodes 20 are formed in an array by the placement of insulators 21 between islands of metal. The insulators are formed from silicon nitride, silicon dioxide or other dielectric materials. To form the insulators 21, the layer of metal for the first electrode 20 is deposited on a substrate (not shown). The deposited metal layer of the first electrodes 20 is then coated with photoresist. The photoresist is developed to expose the metal where the insulators 21 are to be formed. The metal is etched by ion etching in the pattern of the insulators 21. The insulators 21 are deposited in the etched pattern by plasma deposition, spin coating or evaporation of nitrides or fused silica. The light-generating layer 30 is deposited on the array of first electrodes 20 by a deposition process such as vacuum deposition, spin coating or printing.

A grating having a period Λ is formed in the exposed surface of the light-generating layer 30. In an embodiment, the grating is formed by chemical etching or ion etching.

A thin layer of metal, such as silver or gold, is then deposited by a deposition process such as sputtering or resistive evaporation on the grating formed in the light-generating layer 30 to form the corrugated metal layer 50.

The electro-optical layer 60 is then deposited over the corrugated metal layer 50 by a deposition process such as spin coating.

In an alternative embodiment in which the electro-optical layer 60 is a layer of liquid crystal material, the array of second electrodes 70 is formed, as will be described below. The liquid crystal material is then deposited on the array of second electrodes 70 by spin coating. The stack composed of the first electrode 20, the light-generating layer 30 and the corrugated metal layer 50 is then inverted and placed over the electro-optical layer 60 deposited on the array of second electrodes 70.

The array of second electrodes 70 is a segmented layer of transparent conductive material, such as indium tin oxide. The second electrodes 70 are formed in an array by the placement of insulators 71 between islands of metal. The insulators are formed from nitrides, fused silica or other dielectric materials. To form the insulators 71, the layer of conductive material for the second electrodes 70 is deposited on a sacrificial substrate (not shown) or on the diffuser 80. The layer of the conductive material is then coated with photoresist. The photoresist is developed to expose the conductive material where the insulators 71 are to be formed. The conductive material is etched by ion etching in the pattern of the insulators 71. The insulators 71 are deposited in the etched pattern by a deposition process such as plasma deposition, spin coating or evaporation of such dielectric materials as nitrides or fused silica. When the second electrode 70 with insulators 71 is formed on a sacrificial substrate, the substrate is removed by a removal process such as chemical or ion etching.

The spacers 90 are evenly distributed over the surface of the array of first electrodes 20 before the layers 30, 50, and 60 are deposited. Alternatively, the layers 30, 50 and 60 are deposited on the array of first electrodes 20, and the spacers 90 are evenly distributed with a low area density on the surface of the electro-optical layer 60. The spacers are pressed into the layers 30, 50 and 60 until they contact the array of first electrodes 20. In another alternative, the layers 30, 50 and 60 are deposited on the array of first electrodes 20, widely-separated holes having a diameter equal to that of the spacers 90 are etched through the layers 30, 50 and 60 and the spacers 90 are positioned in the etched holes.

Applying a voltage between the first electrodes 20 and second electrodes 70 of each of the color-tunable light emitters 13A–13D causes display 15 to emit output light having a wavelength that depends on the voltage applied to each of the light emitters. The voltage is typically applied using thin film transistors that individually address the first electrodes 20 and/or the second electrodes 70 of the color-tunable light emitters 13A–13D. To ensure the electric field for one light emitter does not spread to adjacent light emitters, the first electrode 20 and second electrode 70 are separated by a distance that is small relative to the dimensions of the light emitter in the plane parallel to the major surface of electrodes 20. These dimensions are of the order of micrometers, for example 4 μm by 4 μm. The layers between the first electrode 20 and second electrode 70 have a total thickness of about 2 μm or less, so spacers 90 have a diameter of about 2 μm or less. When the display 15 incorporates an embodiment of light emitter 11 shown in FIG. 3 having a 1 μm-thick waveguide 51, the layers between the first electrode 20 and second electrode 70 have a total thickness of about 3 μm or less. In this case, spacers 90 have a diameter of about 3 μm or less.

Applying different voltages to the color-tunable light emitters 13A–13D in the optical display 15 causes the light emitters to emit light of different colors. Each of the light emitters 13A–13D is individually addressable, typically by a thin film transistor circuit (not shown).

Independent control of the brightness and color of the light emitted by each of the color-tunable light emitters 13A–13D can be obtained by using the corrugated metal layer 50 as a third electrode common to all the light emitters 13A–13D. This allows independent voltages to be applied to the light-generating layer 30 and to the electro-optical layer 60. The brightness of the light generated by the light-generating layer 30 of each of the light emitters 13A–13D is controlled by the voltage applied between the first electrode 20 and the corrugated metal layer 50 and the color of the light emitted by each of the light emitters 13A–13D is independently controlled by the voltage applied between the second electrode 70 and the corrugated metal layer. In an alternative embodiment, the duty cycle of a drive pulse applied to each light emitter controls the brightness while the amplitude of the drive pulse independently controls the color.

Electrode configurations different from that exemplified in FIG. 5 are possible. In one embodiment, a thin film transistor circuit (not shown) is electrically connected to each of the first electrodes 20, and the second electrodes 70 are electrically connected to a common voltage, such as ground. In another embodiment, a thin film transistor circuit (not shown) is electrically connected to each of the second electrodes 70, and the first electrodes 20 are electrically connected to a common voltage, such as ground. In such embodiments, a common electrode may be used instead of the electrodes connected to a common voltage. In another embodiment, a thin film transistor circuit (not shown) is electrically connected to each of the first electrodes 20 segmented by insulators 21 and another thin film transistor circuit (not shown) is connected to each of the second electrodes 70 segmented by insulators 71.

Figure 7:
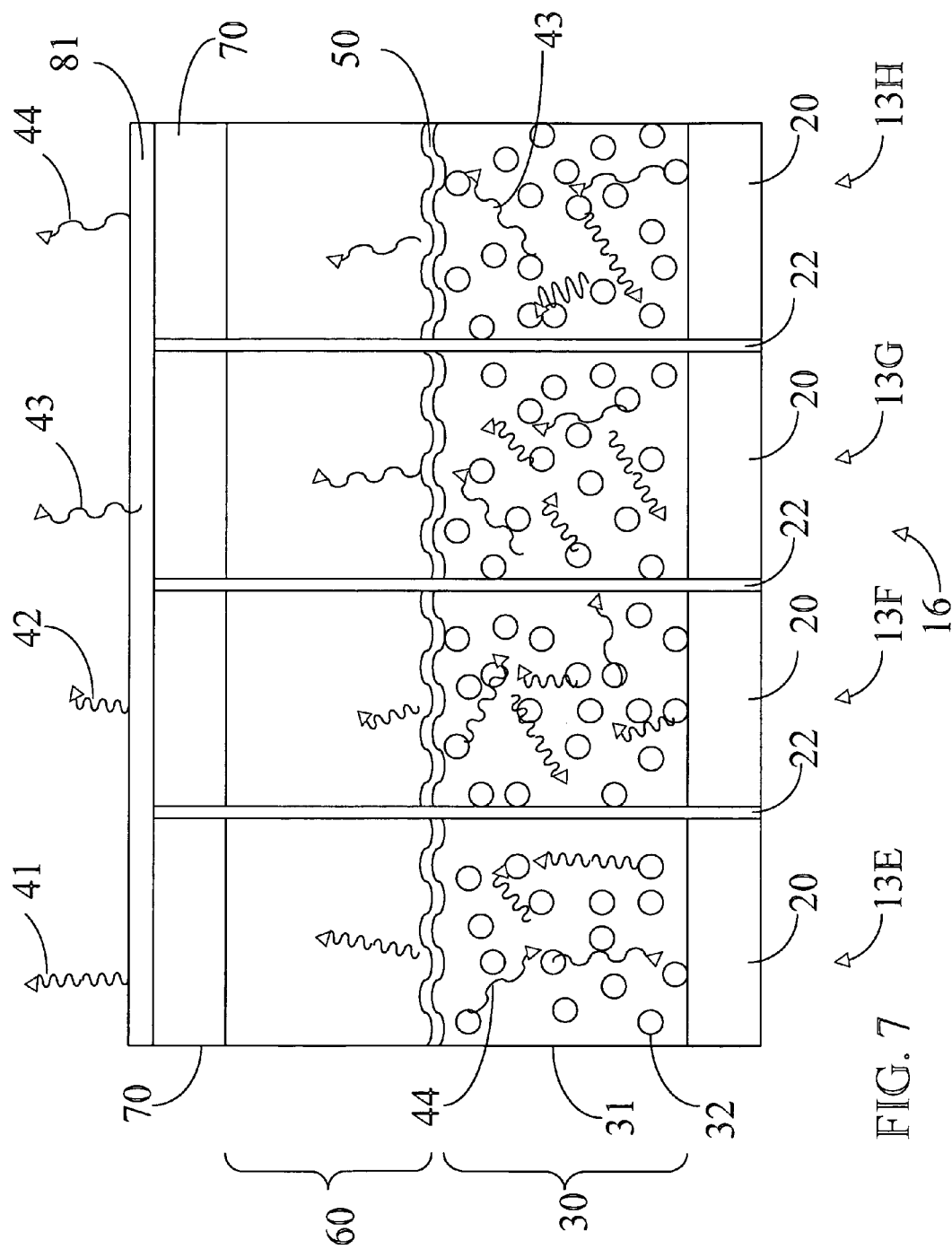
FIG. 7 is a schematic cross sectional view of a second embodiment of a display including color-tunable light emitters similar to those shown in FIG. 5.

FIG. 7, in which like elements share like reference numbers with FIG. 5, is a schematic cross sectional view showing a second embodiment of an optical display 16 in accordance with the present invention. Optical display 16 is composed of color-tunable light emitters 13E through 13H. The color-tunable light emitters 13E through 13H have a structure based on that of light emitter 13 shown in FIG. 5, but could alternatively have a structure based on those of any of the light emitters 10, 11, or 12 shown in the other figures. The individual light emitters 13E through 13H are separated from each other by insulators 22 which extend from the first electrodes 20 to the second electrodes 70 through the light-generating layer 30, the corrugated metal layer 50, and the electro-optical layer 60. The insulators 22 are formed of a nonconductive material such as silicon dioxide, silicon nitride or a polymer.

In one embodiment, an array of insulators 22 is formed to define an array of cavities. The light-generating material of light-generating layer 30 is injected into the cavities defined by the insulators 22. An inkjet printing system, such as one commercially available from Seiko-Epson and Litrex Corporation (a CDT subsidiary), is used to inject the light-generating material into the cavities. A grating is chemically etched into the surface of the light-generating layer 30 in each cavity and the metal of the corrugated metal layer 50 is deposited on the surface of the gratings by a deposition process such as vacuum deposition. The electro-optical layer 60 is deposited on the corrugated metal layer 50 by a deposition process such as evaporation or ink jet deposition. The second electrodes 70 are deposited on the liquid crystal layer 60 by a deposition process such as sputtering, and the diffuser 81 is mounted on the second electrodes 70.

Applying different voltages to the color-tunable light emitters 13E–13H in the optical display 16 causes the light emitters to emit light of different colors. Each of the light emitters 13E—13E is individually addressable, typically by a thin film transistor circuit (not shown).

Electrode configurations different from that exemplified in FIG. 7 are possible. In one embodiment, a thin film transistor circuit (not shown) is electrically connected to each of the first electrodes 20, and the second electrodes 70 are electrically connected to a common voltage, such as ground. In this embodiment, the insulator 22 does not extend completely through the second electrodes 70 so that the second electrodes are electrically interconnected. In another embodiment, a thin film transistor circuit (not shown) is electrically connected to each of the second electrodes 70, and the first electrodes 20 are electrically connected to common voltage, such as ground. The isolator 22 does not extend completely through the first electrodes 20 so that the first electrodes are electrically interconnected.

While the embodiments of the invention disclosed herein are presently considered to be preferred, various changes and modifications can be made without departing from the scope of the invention. The scope of the invention is indicated in the appended claims, and all changes that come within the meaning and range of equivalents are intended to be embraced therein.

I claim:

1. A color-tunable light emitter, comprising:
  a first electrode;
  a light-generating layer adjacent the first electrode, the light-generating layer operable to generate light in a band of wavelengths;
  an electro-optical layer;

a second electrode adjacent the electro-optical layer, and
a corrugated metal layer between the light-generating layer and the electro-optical layer, the corrugated metal layer coupling a sub-band of the light from the light-generating layer to the electro-optical layer, the sub-band having a center wavelength dependent on a voltage applied to at least one of the electrodes.

2. The light emitter of claim 1, additionally comprising a diffuser layer adjacent the second electrode.

3. The light emitter of claim 1, additionally comprising an optical waveguide between the light-generating layer and the corrugated metal layer.

4. The light emitter of claim 3, in which the optical waveguide comprises a layer having a thickness in the range from about 500 nm to about 1,000 nm.

5. The light emitter of claim 4, in which the layer comprises a material selected from nitrides and fused silica.

6. The light emitter of claim 1, in which the light-generating layer comprises a material selected from an electro-luminescent material, a photo-luminescent material, and a cathode-luminescent material.

7. The light emitter of claim 1, in which the electro-optical layer comprises liquid crystal material.

8. The light emitter of claim 7, in which the liquid crystal material is a nematic liquid crystal material and is encapsulated in a porous silicon matrix.

9. The light emitter of claim 1, in which the second electrode is transparent in the band of wavelengths.

10. The light emitter of claim 1, in which:
the light generated by the light-generating layer has a brightness dependent on a first voltage applied between the first electrode and the corrugated metal layer; and
the center wavelength of the sub-band is dependent on a second voltage applied between the second electrode and the corrugated metal layer.

11. A method for generating color-tunable light, the method comprising:
providing an electro-optical layer and a corrugated metal layer;
juxtaposing the corrugated metal layer and the electro-optical layer;
illuminating the corrugated metal layer with light in a band of wavelengths;
coupling a sub-band of the light through the corrugated metal layer to the electro-optical layer, the sub-band having a center wavelength; and
adjusting the refractive index of the electro-optical layer to tune the center wavelength by changing a voltage across the electro-optical layer.

12. The method of claim 11, in which the illuminating comprises:
providing a light-generating layer; and
juxtaposing the light-generating layer and the corrugated metal layer.

13. The method of claim 12, in which:
the light-generating layer comprises photo-luminescent material; and
the illuminating additionally comprises optically pumping the photo-luminescent material.

14. The method of claim 12, in which:
the light-generating layer comprises electro-luminescent material; and
the illuminating additionally comprises applying voltage across the electro-luminescent material.

15. The method of claim 11, in which the illuminating comprises generating the light by one of electro-luminescence, photo-luminescence, and cathode-luminescence.

16. The method of claim 11, in which the illuminating comprises:
providing an optical waveguide layer;
juxtaposing the optical waveguide layer and the corrugated metal layer; and
illuminating the optical waveguide layer.

17. A color display, comprising:
opposed electrodes, at least one of the electrodes comprising electrode segments defining respective color-tunable light emitters; and
between the electrodes, a layer structure comprising:
a light-generating layer operable to generate light in a band of wavelengths,
an electro-optical layer, and
a corrugated metal layer between the light-generating layer and the electro-optical layer, the corrugated metal layer coupling a sub-band of the light generated by the light-generating layer to the electro-optical layer, the sub-band having a center wavelength, the center wavelength of each of the color-tunable light emitters dependent on a voltage applied to the respective one of the electrode segments.

18. The display of claim 17, additionally comprising dielectric spacers between the electrode segments.

19. The display of claim 18, in which the dielectric spacers extend through the layer structure.

20. The display of claim 17, in which the electro-optical layer comprises liquid crystal material.

21. The display of claim 20, in which the liquid crystal material is a nematic liquid crystal material and is encapsulated in a porous silicon matrix.

22. The display of claim 17, in which the second electrode is transparent in the band of wavelengths.

23. The display of claim 17, in which both electrodes comprise electrode segments.

24. The display of claim 23, in which, in each of the color-tunable light emitters:
the light generated by the light-generating layer has a brightness dependent on a first voltage applied between the corrugated metal layer and the respective one of the electrode segments the one of the electrodes adjacent the light-generating layer; and
the center wavelength of the sub-band is dependent on a second voltage applied between the corrugated metal layer and the respective one of the electrode segments of the electrode adjacent the electro-optical layer.

25. A method for generating color-tunable light, the method comprising:
providing an electro-optical layer and a corrugated metal layer;
juxtaposing the corrugated metal layer and the electro-optical layer;
illuminating the corrugated metal layer with light in a band of wavelengths;
coupling a sub-band of the light through the corrugated metal layer to the electro-optical layer, the sub-band having a center wavelength; and
adjusting the refractive index of the electro-optical layer to tune the center wavelength;
wherein the illuminating comprises providing a light-generating layer comprising electro-luminescent material, and juxtaposing the light-generating layer and the corrugated metal layer; and
the illuminating additionally comprises applying voltage across the electro-luminescent material.

* * * * *